(12) United States Patent
Kaneko

(10) Patent No.: US 6,859,476 B2
(45) Date of Patent: Feb. 22, 2005

(54) SURFACE-EMITTING SEMICONDUCTOR LASER AND METHOD OF MANUFACTURING THE SAME

(75) Inventor: Tsuyoshi Kaneko, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 194 days.

(21) Appl. No.: 10/188,802

(22) Filed: Jul. 5, 2002

(65) Prior Publication Data

US 2003/0016713 A1 Jan. 23, 2003

(30) Foreign Application Priority Data

Jul. 9, 2001 (JP) .................................. 2001-208192

(51) Int. Cl.[7] .............................................. H01S 5/00
(52) U.S. Cl. ..................................... 372/45; 438/22
(58) Field of Search ........................... 372/43–50, 96; 438/22–39

(56) References Cited

U.S. PATENT DOCUMENTS

| | | | | | |
|---|---|---|---|---|---|
| 4,999,843 A | * | 3/1991 | Luryi et al. | .................. | 372/45 |
| 5,073,041 A | * | 12/1991 | Rastani | .................. | 372/43 |
| 5,319,655 A | * | 6/1994 | Thornton | .................. | 372/23 |
| 5,394,423 A | * | 2/1995 | Kasahara | .................. | 372/45 |
| 5,468,656 A | * | 11/1995 | Shieh et al. | .................. | 438/32 |
| 5,703,898 A | * | 12/1997 | Ogura | .................. | 372/96 |
| 6,594,295 B1 | * | 7/2003 | Sargent | .................. | 372/45 |

OTHER PUBLICATIONS

U.S. Appl. No. 10/092,777, filed Mar. 8, 2002, Kaneko et al.

* cited by examiner

*Primary Examiner*—Quyen Leung
(74) *Attorney, Agent, or Firm*—Oliff & Berridge, PLC

(57) ABSTRACT

A surface-emitting semiconductor laser having a light-emitting region and a non-light-emitting region, the light-emitting region emitting light in a direction perpendicular to a semiconductor substrate. The light-emitting region includes a resonator formed on the semiconductor substrate. The non-light-emitting region includes a contact region electrically connected to the resonator. The contact region is formed in a layer which is part of a layer including at least part of the resonator but is apart from the part of the resonator, and the contact region has a higher carrier density than the layer in which the contact region is formed.

23 Claims, 8 Drawing Sheets

SURFACE-EMITTING SEMICONDUCTOR LASER AND METHOD OF MANUFACTURING THE SAME

Japanese Patent Application No. 2001-208192, filed on Jul. 9, 2001, is hereby incorporated by reference in its entirety.

BACKGROUND OF THE INVENTION

The present invention relates to a surface-emitting semiconductor laser of excellent efficiency of light emission, and capable of achieving a rapid drive and compact device, and a method of manufacturing the same.

A surface-emitting semiconductor laser is a light-emitting element capable of integration in two dimensions, and is anticipated as the next generation high-speed and large capacity light source, for application to optical parallel communications and optical parallel computation, laser beam printers, and the like.

Such a surface-emitting semiconductor laser generally has a resonator formed on a semiconductor substrate, and this resonator is driven by passing a current in the direction perpendicular to the semiconductor substrate. Since this surface-emitting semiconductor laser has a current flowing in the direction perpendicular to the semiconductor substrate, this commonly has a configuration with respective electrodes provided on the front surface (the surface on which the resonator is provided) of the semiconductor substrate and the rear surface (the surface of the semiconductor substrate opposite to that on which the resonator is provided).

In a surface-emitting semiconductor laser having this configuration, in order to electrically connect the electrodes together, generally the electrodes formed on the rear surface of the semiconductor substrate and the electrodes formed on the front surface of the semiconductor substrate are connected by wires. However, mounting using this manner of wire bonding may interfere with the achievement of rapid drive or a compact device.

BRIEF SUMMARY OF THE INVENTION

The object of the present invention is the provision of a surface-emitting semiconductor laser and method of manufacture thereof of excellent efficiency of light emission, and allowing rapid drive and a compact device to be achieved.

First Surface-emitting Semiconductor Laser

According to the present invention, there is provided a surface-emitting semiconductor laser having a light-emitting region and a non-light-emitting region, in which light is emitted from the light-emitting region in a direction perpendicular to the semiconductor substrate, wherein:

the light-emitting region includes a resonator formed on the semiconductor substrate;

the non-light-emitting region includes a contact region electrically connected to the resonator; and the contact region is formed in a layer which is part of a layer including at least part of the resonator but is a part from the part of the resonator, the contact region having a higher carrier density than the layer in which the contact region is formed.

The direction perpendicular to the semiconductor substrate means a direction perpendicular to the surface of the semiconductor substrate on which the resonator is mounted.

The light-emitting region refers to a region including a region in which the laser light is oscillated and from which the laser light is emitted, while the non-light-emitting region refers to a region other than the light-emitting region.

According to the surface emission laser of the present invention, by forming the contact region in the non-light-emitting region, the influence of light absorption and dispersion occurring in the contact region on the efficiency of light emission of the resonator can be reduced, and therefore laser light can be emitted without lowering the efficiency of light emission. Furthermore, mounting using the wire bonding that is in general use is not required, and since it is possible to form a pair of electrodes in a single plane of the semiconductor substrate, rapid drive and a compact device can be achieved.

The surface-emitting semiconductor laser may have following features (1) to (5).

(1) The resonator in the light-emitting region may have a pillar portion.

In this case, the resonator may be formed by deposition of a first mirror, an active layer, and a second mirror in sequence; and the pillar portion may include the second mirror and the active layer.

Moreover, the contact region may be formed in a layer which is part of a layer including the first mirror but is apart from the first mirror.

Furthermore, the contact region may have a higher carrier density than the layer including the first mirror. According to this configuration, excellent ohmic contact can be obtained, and an element having excellent efficiency of light emission can be implemented.

(2) The surface-emitting semiconductor laser may further comprise first and second electrodes for supplying a current to the resonator, wherein the second electrode is electrically connected to the resonator with the contact region interposed.

In this case, the surface-emitting semiconductor laser may further comprise:

an insulating layer formed around the pillar portion; and a contact portion electrically connecting the second electrode and the contact region, wherein the contact portion includes a contact hole formed in the insulating layer, and a conductive layer with which the contact hole is filled.

Moreover, the first and second electrodes may be formed in substantially the same plane. According to this configuration, rapid drive is possible, and excellent electrodes of low breakage and low parasitic capacitance can be formed. For example, bumps or the like can easily be formed on the first electrode and the second electrode.

(3) The carrier density in the contact region may be at least $5 \times 10^{18}$ cm$^{-3}$. According to this configuration, excellent ohmic contact can be obtained.

(4) A topmost layer of the layers forming the contact region may be formed of an aluminum-gallium-arsenic layer; and the aluminum content of the topmost layer may be equal to or less than 20%. According to this configuration, excellent ohmic contact can be obtained.

(5) Light may be emitted from a rear surface of the semiconductor substrate.

Method of Manufacturing a Surface-emitting Semiconductor Laser

According to the present invention, there is provided a method of manufacturing a surface-emitting semiconductor laser having a light-emitting region and a non-light-emitting region, in which light is emitted from the light-emitting region in a direction perpendicular to the semiconductor substrate, the method comprising the steps of:

(a) forming a resonator on the semiconductor substrate in a region for forming the light-emitting region, and forming a layer which is part of a layer including at least part of the resonator but apart from the part of the resonator, in a region for forming the non-light-emitting region; and (b) forming a contact region in the layer which is part of the layer including at least part of the resonator, in the region for forming the non-light-emitting region, the contact region having a higher carrier density than the layer which is part of the layer including at least part of the resonator.

According to the method of manufacturing a surface-emitting semiconductor laser of the present invention, a surface-emitting semiconductor laser of excellent efficiency of light emission, and allowing rapid drive and a compact device to be achieved can be obtained by a convenient method.

The method of manufacturing a surface-emitting semiconductor laser may have following features (1) to (7).

(1) The step (a) may include a step of forming a pillar portion in the resonator, in the region for forming the light-emitting region.

(2) The step (a) may include a step of forming the resonator by depositing a first mirror, an active layer, and a second mirror in sequence, and then forming the pillar portion including at least the second mirror and the active layer.

In this case, the step (b) may include a step of forming the contact region in a layer which is part of a layer including the first mirror but is apart from the first mirror.

Moreover, the step (b) may include a step of forming the contact region such that the carrier density is higher than the carrier density in the layer including the first mirror.

(3) The method of manufacturing a surface-emitting semiconductor laser may further comprise the step of:

(c) forming first and second electrodes for supplying a current to the resonator, the second electrode being electrically connected to the resonator with the contact region interposed.

In this case, the step (b) may further include a step of forming an insulating layer around the pillar portion; and the step (c) may further include a step of forming a contact hole at a predetermined position of the insulating layer, and a step of filling the contact hole with a conductive material to form a contact portion electrically connecting the second electrode and the contact region.

(4) The contact region may be formed to have the carrier density equal to or more than $5 \times 10^{18}$ cm$^{-3}$ in step (b).

(5) A topmost layer of the layers forming the contact region may be formed of an aluminum-gallium-arsenic layer, having an aluminum content equal to less than 20% in step (b).

(6) The contact region may be formed by impurity diffusion in step (b).

(7) The contact region may be formed by ion implantation in step (b).

DETAILED DESCRIPTION OF THE EMBODIMENTS

One embodiment of the present invention is now described with reference to the drawings.

First Embodiment (Device Configuration)

Figure 1:
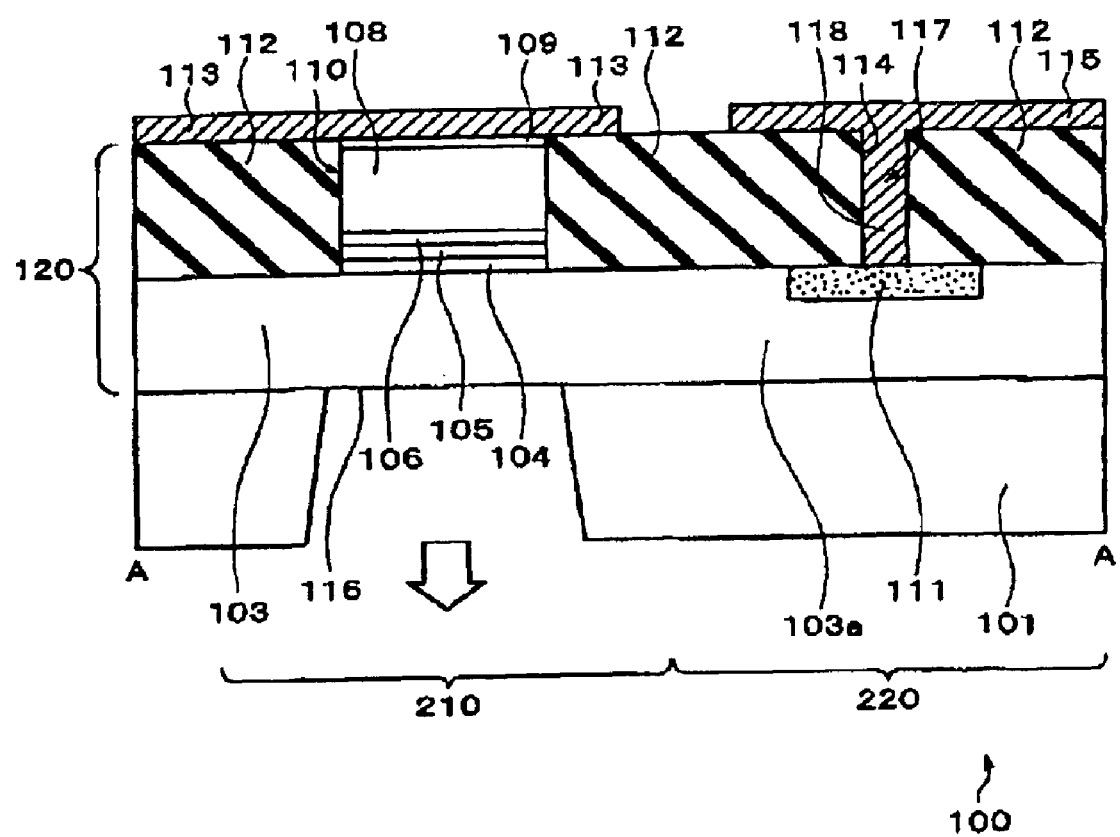
FIG. 1 is a sectional view schematically showing a first embodiment of the surface-emitting semiconductor laser of the present invention, taken along the line A—A of FIG. 2.
Figure 2:
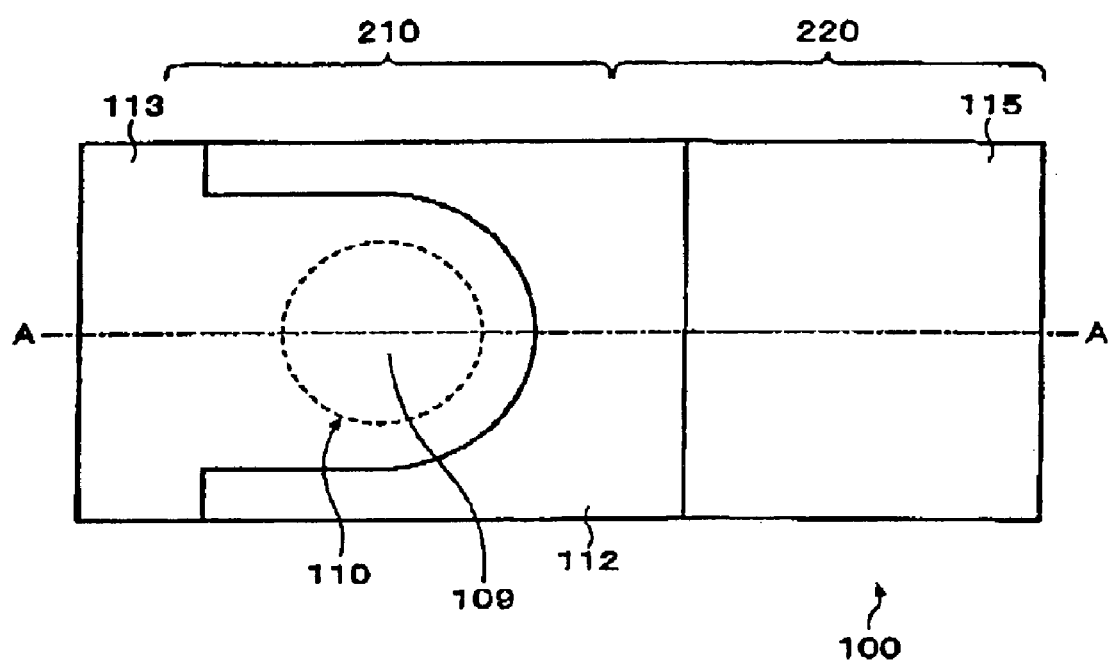
FIG. 2 is a schematic plan view showing the surface-emitting semiconductor laser shown in FIG. 1.

First, the configuration of the first embodiment of the surface-emitting semiconductor laser 100 (hereinafter referred to as "surface emission laser") of the present invention is described using FIGS. 1 and 2. FIG. 1 illustrates schematically a section of the first embodiment of the surface emission laser 100 of the present invention, and is a section taken along the line A—A in FIG. 2. FIG. 2 is a plan view schematically showing the surface emission laser 100 shown in FIG. 1.

The surface emission laser 100 is constituted by a light-emitting region 210 and a non-light-emitting region 220. In the light-emitting region 210, a resonator 120 is formed. The resonator 120 is formed on a semiconductor substrate 101, being for example a GaAs substrate. In this embodiment, the case is shown in which in the light-emitting region 210, in at least a part of the resonator 120 a pillar portion 110 is formed. The resonator 120 is formed by lamination in sequence of a buffer layer (not shown in the drawings) of for example n-type GaAs, a first mirror 103, an n-type cladding layer 104, an active layer 105, a p-type cladding layer 106, and a second mirror 108. The first mirror 103 is formed by a distributed reflection type multilayer mirror of, for example, 30 pairs of alternately laminated n-type $Al_{0.9}Ga_{0.1}As$ and $Al_{0.2}Ga_{0.8}As$. The n-type cladding layer 104 is formed of, for example, n-type $Al_{0.5}Ga_{0.5}As$. The active layer 105 comprises for example GaAs well layers of thickness 4 nm and $Al_{0.3}Ga_{0.7}As$ barrier layers of thickness 4 nm in which the well layers form a three-layer quantum well structure. The p-type cladding layer 106 is formed of, for example, p-type $Al_{0.5}Ga_{0.5}As$. The second mirror 108 is formed by a distributed reflection type multilayer mirror of 25 pairs of alternately laminated for example p-type $Al_{0.9}Ga_{0.1}As$ and $Al_{0.2}Ga_{0.8}As$.

The second mirror 108 is of p-type by zinc doping, and the first mirror 103 is n-type by silicon doping. Therefore, the second mirror 108, the quantum well active layer 105 doped with no impurity, and the first mirror 103 form a pin diode.

The pillar portion 110, as shown in FIGS. 1 and 2, is a pillar-shaped semiconductor deposition body constituting at least a part of the resonator 120, and is formed by lamination of the n-type cladding layer 104, active layer 105, p-type cladding layer 106, and second mirror 108 in sequence. It should be noted that, in this embodiment, the plan form of the pillar portion 110 is circular, but this form may be an arbitrary form.

In the non-light-emitting region 220 is formed a contact region 111 electrically connected to the resonator 120. In the non-light-emitting region 220, the contact region 111 is formed in a layer which is part of a layer 103a including at least part of the resonator 120 but is apart from the part of the resonator 120, and the contact region 111 has a higher carrier density than the layer 103a in which the contact region 111 is formed. According to this configuration, an element in which excellent ohmic contact is obtained, and of excellent efficiency of light emission can be implemented. In the surface emission laser 100 of this embodiment, as shown in FIG. 1, the contact region 111 is formed on the layer 103a linking to a layer constituting the first mirror 103, and formed so that the carrier density of the contact region 111 is higher than that of the linking layer 103a. This linking layer 103a is formed using the same material as the first mirror 103, in the same step.

This contact region 111 is formed, for example, by introducing an n-type carrier into a particular region of the first mirror 103. As examples of the carrier introduced into the contact region 111 may be cited zinc when a p-type carrier is introduced, or silicon when an n-type carrier is introduced. In the surface emission laser 100 of this embodiment, in order to obtain excellent ohmic contact, the carrier density in the contact region 111 is preferably at least $5 \times 10^{18}$ cm$^{-3}$.

In the surface emission laser 100 of this embodiment, the topmost layer forming the contact region 111, similarly to the topmost layer constituting the first mirror 103, is formed from a layer with a principal constituent of AlGaAs (aluminum-gallium-arsenic). In this case, in order to obtain excellent ohmic contact, the aluminum content of the topmost layer forming the contact region 111 is preferably not more than 20%.

The contact region 111 is electrically connected by ohmic contact to a second electrode 115 described below. Since the resonator 120 and second electrode 115 are electrically connected through this contact region 111, mounting using the wire bonding that is in general use is not required, and the objectives of rapid drive and a compact device can be achieved.

On the contact region 111, a contact portion 117 is formed. The contact portion 117 is formed by a conductive layer 118 embedded in a contact hole 114 provided in an insulating layer 112 described below. With this contact portion 117 interposed, the second electrode 115 described below and the contact region 111 are electrically connected. The conductive layer 118 can be formed of the same material as the second electrode 115.

Around the pillar portion 110, the insulating layer 112 is formed. This insulating layer 112 is formed on the first mirror 103 constituting the resonator 120. The insulating layer 112 insulates the adjacent pillar portion 110, while also functioning to reduce the parasitic capacitance generated in the device. This insulating layer 112 is formed, for example, of polyimide resin or the like.

The depth of the contact hole 114 is substantially equal to the depth of the insulating layer 112. In other words, the depth of the contact hole 114 is substantially equal to the height of the pillar portion 110, and therefore to form the contact portion 117, it is sufficient to form the contact hole 114 to have a depth of the same order as the height of the pillar portion 110. Therefore, ohmic contact between the second electrode 115 described below and the contact region 111 can be obtained by a convenient method.

On the surface emission laser 100 are formed first and second electrodes 113 and 115 for injecting a current into the resonator 120. The first electrode 113 is formed on the top surface of the pillar portion 110 and insulating layer 112. Since on the top surface of the pillar portion 110, a contact layer 109 for example of p-type GaAs is formed, the pillar portion 110 and first electrode 113 are electrically connected through the contact layer 109. The first electrode 113 has for example a multilayer structure constituted by an alloy of gold and zinc, and gold. The second electrode 115 is formed on the contact region 111 with the contact portion 117 interposed. This second electrode 115 is electrically connected to the resonator 120 through the contact portion 117 and contact region 111. The second electrode 115 has a multilayer structure constituted for example by an alloy of gold and germanium, and gold.

In general, an electrode formed on a surface having steps has a higher risk of breakage than an electrode formed on a flat surface. Generally, if an electrode is bent, this generates parasitic capacitance. The occurrence of this parasitic capacitance interferes with a rapid drive, and therefore it is preferable to reduce the occurrence of bending of the electrode as much as possible. According to the surface emission laser 100 shown in FIGS. 1 and 2, both the first electrode 113 and second electrode 115 are formed on the flat insulating layer 112, and therefore an excellent electrode can be formed, for which rapid drive is possible, breakage is reduced, and the parasitic capacitance is low.

Furthermore, according to the surface emission laser 100 of this embodiment, since the first electrode 113 and second electrode 115 are formed in the same plane (the top surface of the insulating layer 112), bumps and the like can easily be formed on these electrodes. That is to say, since a pair of electrodes can be formed on the same surface of the semiconductor substrate, mounting using the wire bonding that is in general use is not required, and compactness can be achieved.

In the surface emission laser 100 shown in FIGS. 1 and 2, laser light is emitted from the rear surface of the semiconductor substrate 101. That is to say, a part of the rear surface of the semiconductor substrate 101 is removed by etching or the like, an emission aperture 116 is formed, and laser light is emitted from this emission aperture 116. It should be noted that, the direction of emission of the laser light is not restricted to being emitted from the rear surface of the semiconductor substrate 101, and can also be emitted in the direction opposite to the direction of emission shown in FIG. 1. For example, if an aperture (not shown in the drawings) is provided in a portion of the first electrode 113 formed on the top surface of the pillar portion 110, laser light can be emitted with this aperture as an emission aperture.

It should be mentioned that generally, the compound semiconductor used in a surface-emitting semiconductor laser does not provide ohmic contact by simple contact between the semiconductor layer and a metal, and a stable current supply is not possible. In contrast, with the surface emission laser 100 of this embodiment, the contact region 111 is formed in the non-light-emitting region 220, in a layer linking to a layer constituting at least a part of the resonator 120, and is formed so that the carrier density in the contact region 111 is higher than that of this linking layer, whereby excellent ohmic contact can be obtained, and a stable current supply is possible.

Generally the higher the carrier density in the layer, the higher the light absorption and dispersion. Therefore, for example, in the surface emission laser 100, if a layer having high light absorption and dispersion is present in the pillar portion 110, the first mirror 103, or other parts that function as the resonator, the efficiency of light emission of the resonator is reduced, and the problem occurs that the intensity of the emitted laser light is low. Therefore, if as in the case of the contact region 111, a layer with a carrier density which is high compared to the layers constituting the resonator 120 is present in a portion functioning as the resonator, the efficiency of light emission is reduced, and the problem occurs that the intensity of the emitted laser light is lower.

In contrast, in the surface emission laser 100 of this embodiment, as shown in FIGS. 1 and 2, the contact region 111 of which the light absorption and dispersion is high is formed in the non-light-emitting region 220. By means of this, the influence of the light absorption and dispersion occurring in the contact region 111 on the efficiency of light emission of the resonator 120 can be reduced, and therefore laser light can be emitted without the efficiency of light emission being reduced.

(Device Operation)

The general operation of the surface emission laser 100 of this embodiment is as follows.

When a voltage is applied in the forward direction to the pin diode constituted by the second mirror 108, active layer 105, and first mirror 103, by the first electrode 113 and second electrode 115, in the active layer 105 the recombination of electrons and positive holes occurs, and light is generated by this recombination. The light thus generated, in oscillating between the second mirror 108 and the first mirror 103 causes stimulated emission, and the light intensity is amplified. When the optical gain exceeds the optical losses, laser emission occurs, and laser light is emitted from the emission aperture 116 formed in the rear surface of the semiconductor substrate 101, in the direction perpendicular to the semiconductor substrate 101.

(Manufacturing Method)

Figure 3:
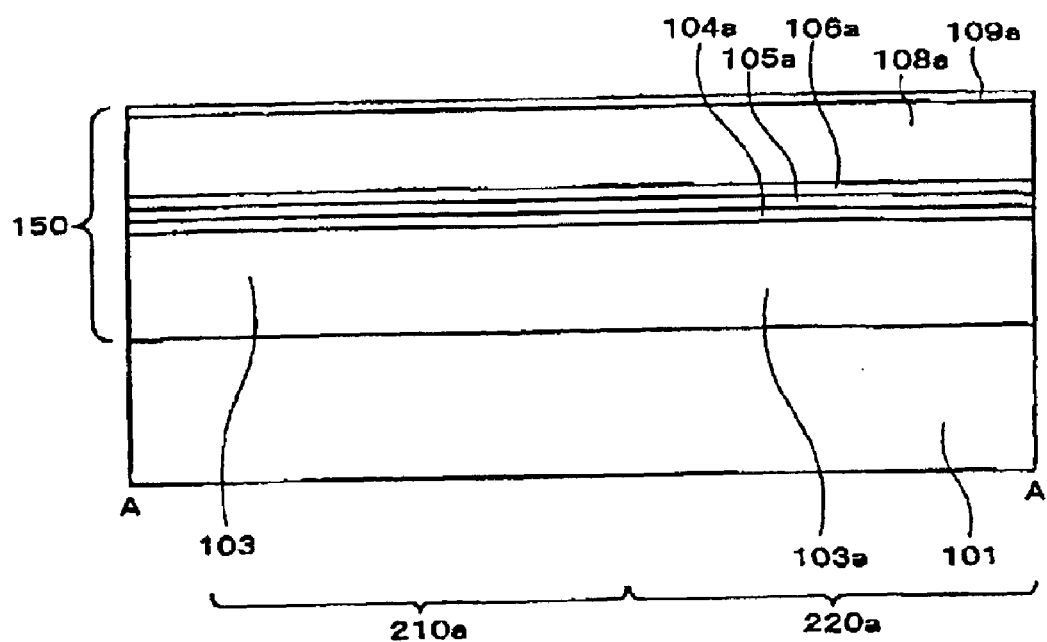
FIG. 3 is a schematic sectional view of one step in the method of manufacturing a surface-emitting semiconductor laser shown in FIG. 1, corresponding to the section shown in FIG. 1.
Figure 4:
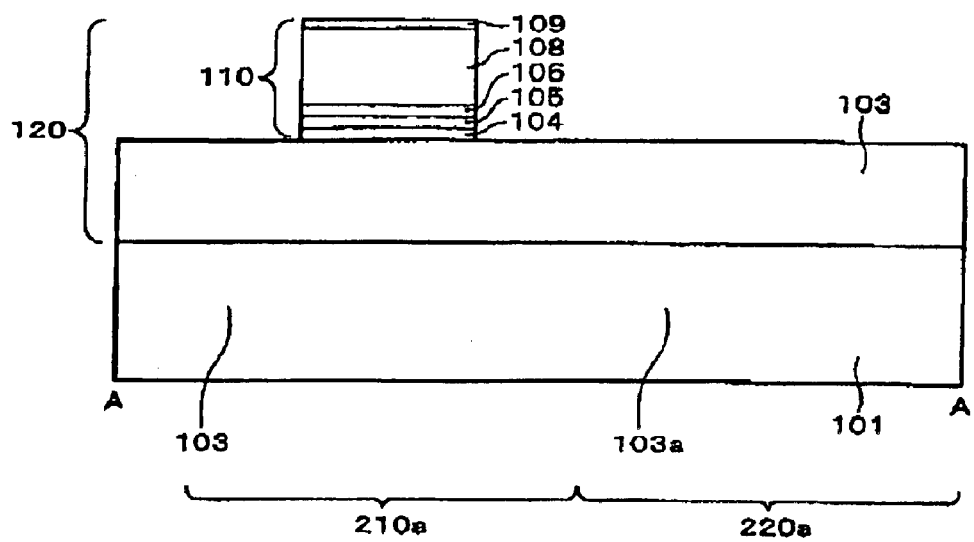
FIG. 4 is a schematic sectional view of one step in the method of manufacturing the surface-emitting semiconductor laser shown in FIG. 1, corresponding to the section shown in FIG. 1.

Next, the method of manufacturing the first embodiment of the surface emission laser 100 of the present invention is described using FIGS. 3 to 7. FIG. 3 and FIGS. 5 to 7 are sectional views showing schematically one step in the method of manufacturing the surface emission laser 100 shown in FIG. 1. FIG. 4 is a plan view showing schematically one step in the method of manufacturing the surface emission laser 100 shown in FIG. 3.

The method of manufacturing the surface emission laser 100 of this embodiment has principally the following steps (a) and (b).

Step (a) is principally a step in which, in a region 210a for forming the light-emitting region 210 (hereinafter referred to as the "light-emitting region formation region 210a"), the resonator 120 is formed on the semiconductor substrate 101, and in a region 220a for forming the non-light-emitting region 220 (hereinafter referred to as the "non-light-emitting region formation region 220a"), a layer which is part of a layer including at least a part of the resonator but apart from the part of the resonator is formed.

Step (b) is principally a step in which, in the non-light-emitting region formation region 220a, the contact region 111 is formed on this linking layer. Here, the contact region 111 is formed to have a carrier density higher than that of the linking layer.

First, step (a) is described.

(a) As shown in FIG. 3, on the semiconductor substrate 101 formed of for example n-type GaAs, the composition is modified by using MOCVD (Metal-Organic Chemical Vapor Deposition), MBE (Molecular Beam Epitaxy), or LPE (Liquid Phase Epitaxy), while semiconductor deposition layers 150 are formed in the light-emitting region formation region 210a and non-light-emitting region formation region 220a.

The semiconductor deposition layers 150 are formed by deposition in sequence of a buffer layer (not shown in the drawings) formed of for example n-type GaAs, a first mirror 103 formed by a distributed reflection type multilayer comprising 30 pairs of alternately laminated n-type $Al_{0.9}Ga_{0.1}As$ and $Al_{0.2}Ga_{0.8}As$, an n-type cladding layer 104a formed of n-type $Al_{0.5}Ga_{0.5}As$, an active layer 105a formed from a GaAs well layer for example of thickness 4 nm and a $Al_{0.3}Ga_{0.7}As$ barrier layer of thickness 4 nm, in which the well layers form a three-layer quantum well structure, a p-type cladding layer 106a formed of p-type $Al_{0.5}Ga_{0.5}As$, a second mirror 108a formed by a distributed reflection type multilayer comprising 25 pairs of alternately laminated p-type $Al_{0.9}Ga_{0.1}As$ and $Al_{0.2}Ga_{0.8}As$, and a contact layer 109a formed of n-type GaAs.

Here, the second mirror 108a is made p-type by doping with zinc, and the first mirror 103 is made n-type by doping with silicon.

The temperature when carrying out epitaxial growth is determined appropriately, depending on the type of semiconductor substrate 101, and on the type and thickness of the layers making up the semiconductor deposition layers 150, but generally is preferably in the range 600 to 800° C. The time required to carry out epitaxial growth is determined appropriately in the same way as the temperature.

Figure 5:
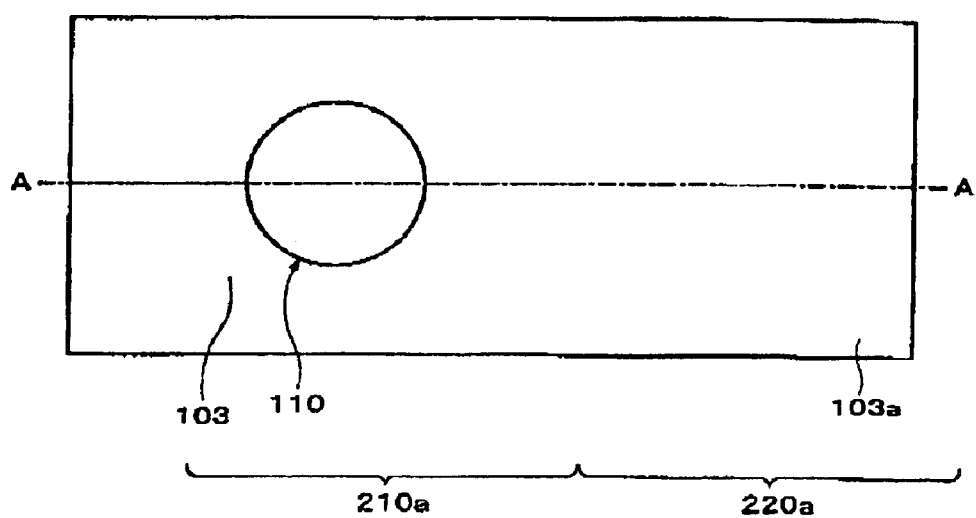
FIG. 5 is a schematic plan view of the step in the method of manufacturing the surface-emitting semiconductor laser shown in FIG. 4.

Continuing, on the contact layer 109a, a photoresist (not shown in the drawings) is applied, after which the photoresist is patterned by a photolithography process, and a resist layer (not shown in the drawings) of a particular pattern is formed. Then with this resist layer as a mask, by the dry etching method, from the contact layer 109a to the n-type cladding layer 104a is etched, whereby as shown in FIGS. 4 and 5, in the light-emitting region formation region 210a, the pillar portion 110 including the second mirror 108, p-type cladding layer 106, active layer 105, and n-type cladding layer 104, and the contact layer 109 formed on the top surface of the pillar portion 110 are formed. By means of this process, the resonator 120 including in at least part this pillar portion 110 is obtained. In the non-light-emitting region formation region 220a, a layer linking to a layer constituting at least a part of the resonator 120 is formed. In this embodiment, as shown in FIG. 4, the case in which, in the non-light-emitting region formation region 220a, the layer 103a linking to the first mirror 103 is formed is shown.

Next, step (b) is described. In this step, first, around the pillar portion 110 the insulating layer 112 is formed. In this embodiment, in the process described below, the contact hole 114 is formed in the insulating layer 112, and this contact hole 114 is filled with the conductive layer 118 to form the contact portion 117, whereby in the light-emitting region formation region 210a and non-light-emitting region formation region 220a, an overall insulating layer 112 is formed.

Figure 6:
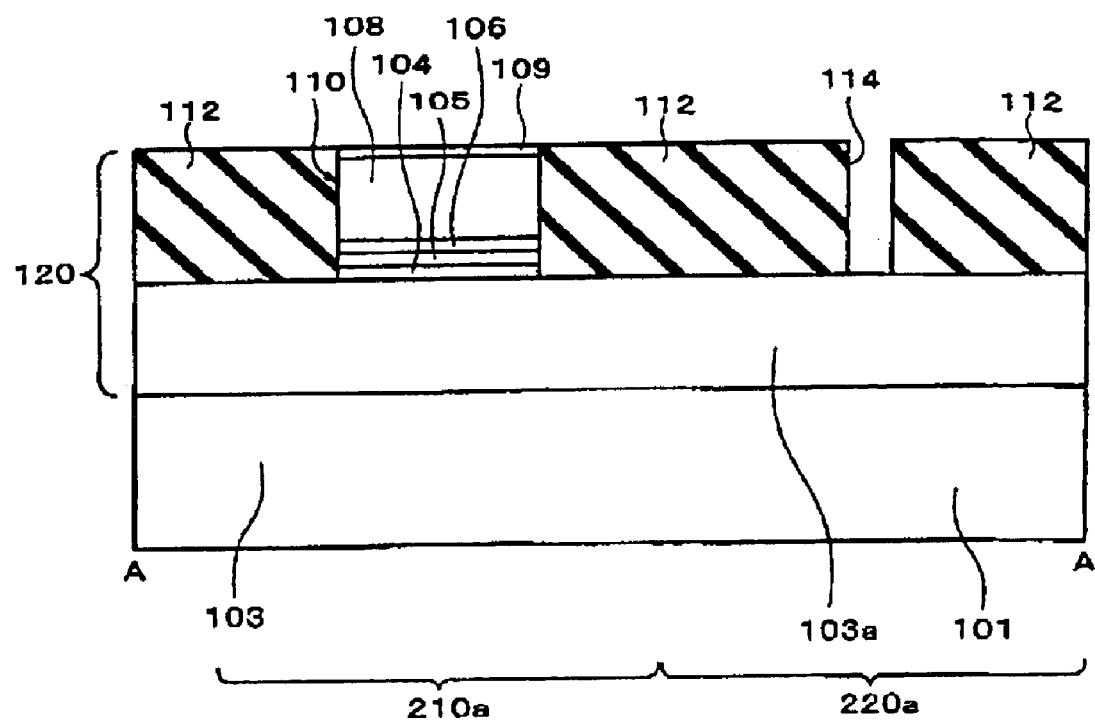
FIG. 6 is a schematic sectional view of one step in the method of manufacturing the surface-emitting semiconductor laser shown in FIG. 1, corresponding to the section shown in FIG. 1.

(b) First, resin in liquid form or a resin precursor in liquid form (not shown in the drawings) is applied overall, and then dried. As the method of application may be used spin coating, dipping, spray coating, or other well-known techniques. Next, by applying energy such as heat or light to the resin material within the applied liquid form, a cured resin is formed. Then the part of the resin that is not required is removed. By the above process, as shown in FIG. 6, around the pillar portion 110 the insulating layer 112 is formed. As the method of removing the part of the resin that is not required may be used, patterning of the resin using photolithography, the method of dry etching, the CMP method, and the like. For example by the method disclosed in U.S. patent application Ser. No. 10/092,777 by the present inventor, by removing the part of the formed resin that is not required, the insulating layer 112 can be formed.

At the same time as this removal process, or in a separate step from this removal process, as shown in FIG. 6, in the non-light-emitting region formation region 220a, the contact hole 114 is formed at a predetermined position in the insulating layer 112. The contact hole 114 is formed in a portion positioned over the region of the insulating layer 112 in which in a later step the contact region 111 is formed on the first mirror 108. The contact hole 114 is formed by patterning, using for example photolithography.

As the resin in liquid form or resin precursor in liquid form used in the above process is used a resin which is cured by the application of heat or light or suchlike energy. As the resin in liquid form can be cited, for example, polyacrylic resins, and epoxy resins. As the resin precursor in liquid form can be cited polyimide precursors.

As polyimide resins can be cited, for example, polyamic acid, and long-chain alkyl esters of polyamic acid and the like. When a polyimide resin is used as the resin precursor in liquid form, after the polyimide precursor in liquid form is applied, heat processing is applied, whereby an imidization reaction occurs, and the polyimide resin is created, to form the insulating layer 112. The temperature of the heat processing depends on the type of polyimide precursor, but from 150 to 400° C. is appropriate.

When as a resin in liquid form a polyacrylic resin, or epoxy resin is used, a polyacrylic resin or epoxy resin of the type cured by ultraviolet is preferably used. A resin of the type cured by ultraviolet can be cured simply by irradiation with ultraviolet, and therefore problems such as damage to the element by heat and the like do not occur.

Figure 7:
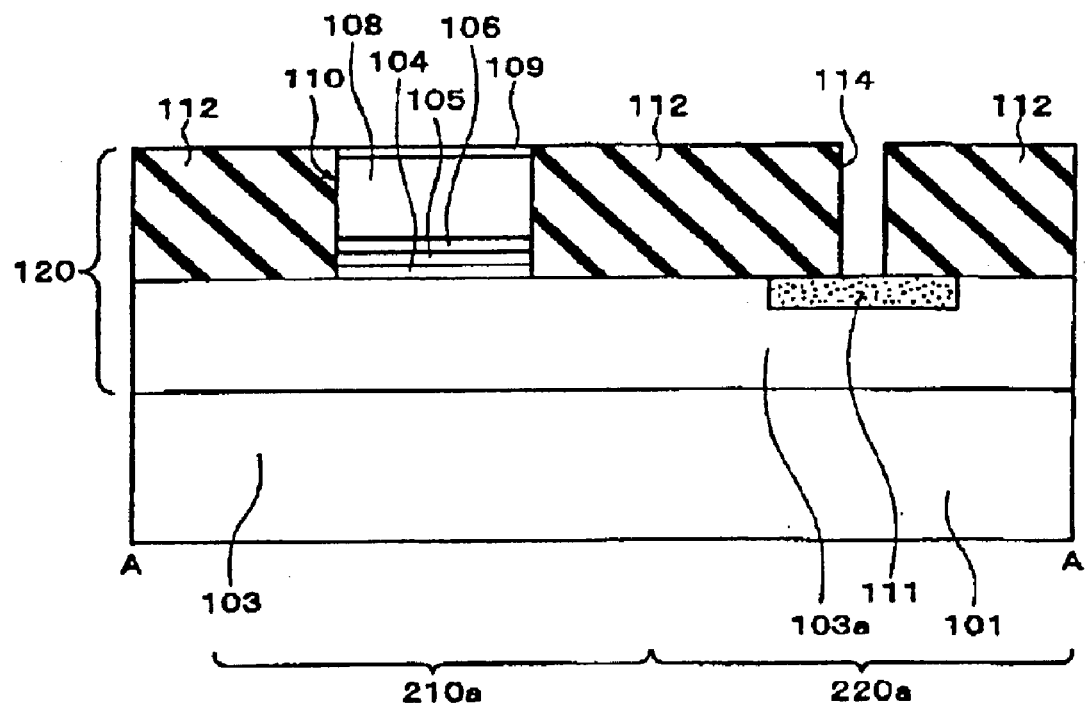
FIG. 7 is a schematic sectional view of one step in the method of manufacturing the surface-emitting semiconductor laser shown in FIG. 1, corresponding to the section shown in FIG. 1.

Next, in the non-light-emitting region formation region 220a, in a layer linking to a layer constituting at least a part of the resonator 120, silicon is introduced by the ion implantation method, and an n-type contact region 111 is formed. In this embodiment, as shown in FIG. 7, the case is described in which the contact region 111 is formed on the layer 103a linking to the first mirror 103. In this case, with the topmost layer of the layers constituting the contact region 111 being of aluminum-gallium-arsenic, and using the topmost layer of which the aluminum content is not more than 20%, the contact region 111 can be formed.

The contact region 111 is formed to have a higher carrier density than the layer linking to a layer constituting at least a part of the resonator 120. In this embodiment, the contact region 111 is formed to have a higher carrier density than the layer 103a linking to the first mirror 103. It is preferable that the carrier is introduced so that the carrier density in the contact region 111 is at least $5 \times 10^{18}$ cm$^{-3}$.

It should be noted that, in the above described process, the case was described in which by the ion implantation method silicon is introduced, forming an n-type contact region, but in the case that a p-type contact region is formed, for example the contact region can be formed by a method of impurity diffusion such as the thermal diffusion method or the like, to introduce zinc.

Next, the step of forming the pair of electrodes 113 and 115 to supply a current to the resonator 120 is described.

(c) By means of vacuum vapor deposition, deposition layers (not shown in the drawings) are formed on the insulating layer 112, of for example an alloy of gold and zinc, and gold. Next, using photolithography, the alloy layer(s) is patterned to a particular pattern, whereby as shown in FIGS. 1 and 2, the first electrode 113 is formed. The contact hole 114 is formed in a part of the insulating layer 112 positioned over the contact region 111, and the contact hole 114 is filled with a conductive material, while by the same method as that for forming the first electrode 113, the second electrode 115 is formed for example of an alloy of gold and germanium, and gold. By this process, together with the second electrode 115, the contact portion 117 formed by filling the contact hole 114 with the conductive layer 118 is obtained. This conductive layer 118 and the second electrode 115 can be formed of the same material.

Next, the configuration obtained from the above described process is subjected to heat processing at 350° C., and ohmic contact between the first electrode 113 and the contact layer 109, and between the contact portion 117 and the contact region 111 is achieved.

Furthermore, after applying patterning to the semiconductor substrate 101 using photolithography, wet etching or dry etching is carried out, whereby the portion of the front surface of the semiconductor substrate 101 where the pillar portion 110 is formed is removed, and as shown in FIG. 1, the emission aperture 116 is formed. Through the course of the above process, the surface emission laser 100 shown in FIGS. 1 and 2 is obtained.

As described above, according to the method of manufacturing this embodiment, a surface emission laser 100 of excellent efficiency of light emission, and more over permitting the achievement of rapid drive and a compact device, can be obtained by a convenient method.

(First Modification)

Figure 8:
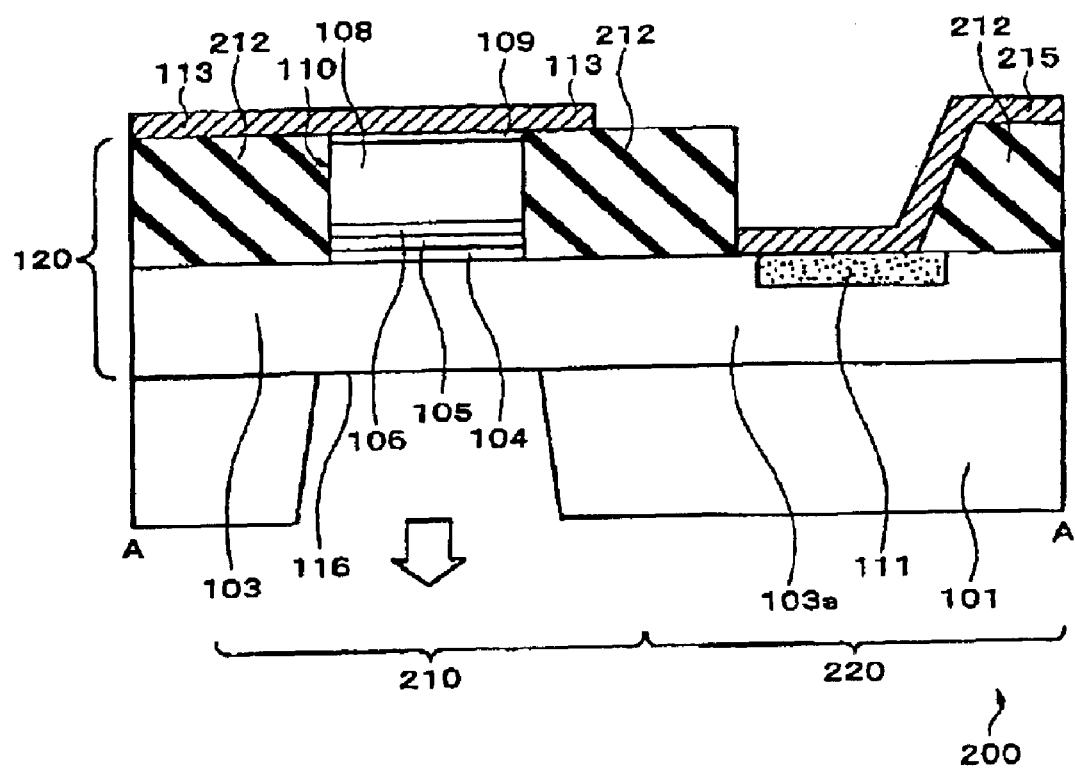
FIG. 8 is a schematic sectional view of a first modification of the surface-emitting semiconductor laser shown in FIG. 1.

FIG. 8 is a sectional view of a first modification of this embodiment of the surface emission laser.

In the surface emission laser 100 shown in FIG. 1, the case has been described that the contact region 111 and second electrode 115 are contacted with the contact portion 117 interposed, but as in the surface emission laser 200 shown in FIG. 8, the contact region 111 and a second electrode 215 can be directly contacted without a contact portion interposed. Except for the fact that no contact portion is provided, and the portion of the insulating layer 212 formed on the first mirror 103 and the layer 103a linking to the first mirror 103 which is positioned over the portion forming the contact region 111 is removed, after which the second electrode 215 is directly formed on this portion, the surface emission laser 200 shown in FIG. 8 is obtained by a substantially similar process as the surface emission laser 100 shown in FIG. 1, and substantially the same effect and benefit as that of the surface emission laser 100 is obtained.

Second Embodiment (Device Configuration)

Figure 9:
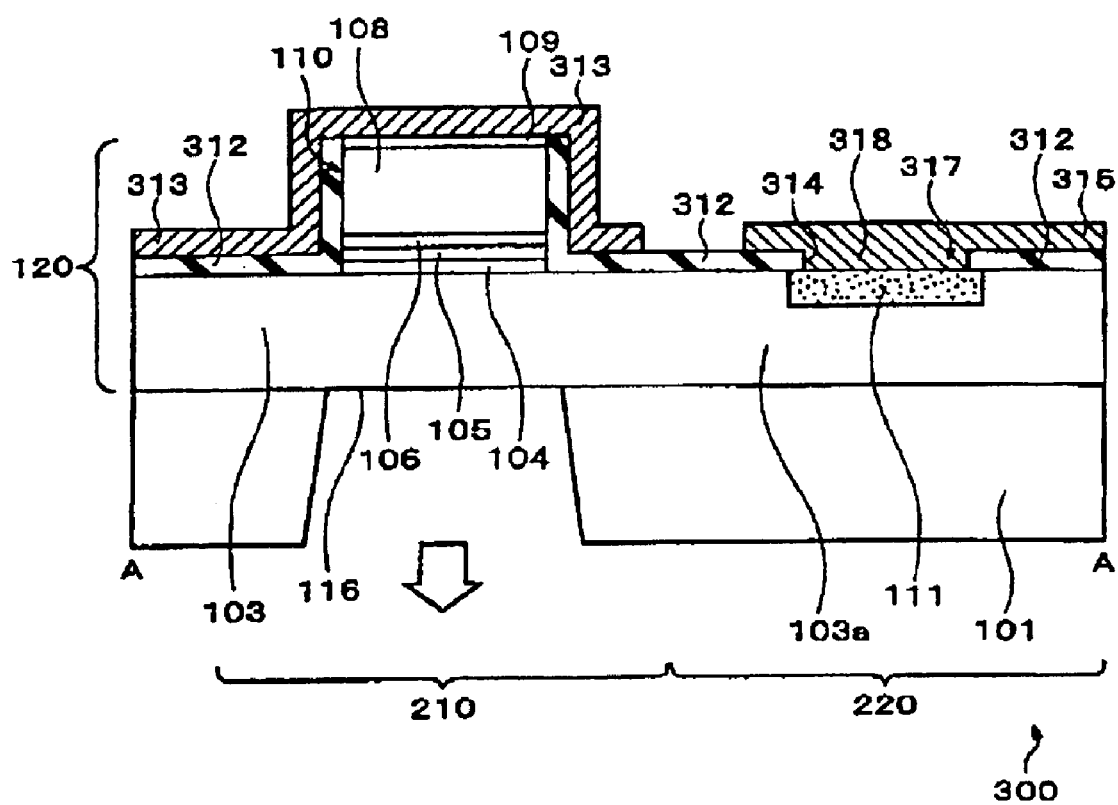
FIG. 9 is a schematic view of a section of a second embodiment of the surface-emitting semiconductor laser of the present invention.

Next, the configuration of a second embodiment of a surface emission laser 300 of the present invention is described with reference to FIG. 9. FIG. 9 shows schematically a section through the second embodiment of the surface emission laser 300 of the present invention.

The surface emission laser 300 shown in FIG. 9 differs in configuration from the first embodiment of the surface emission laser 100 in that an insulating layer 312 is formed to extend along the side surface of the pillar portion 110 and the top surface of the resonator 120. On the other hand, the surface emission laser 300 shown in FIG. 9 has, like the surface emission laser 100 shown in FIG. 1, the contact region 111 and a second electrode 315 electrically connected with a contact portion 317 interposed. Since other portions of the configuration are substantially the same as those of the first embodiment of the surface emission laser 100, for those portions of the surface emission laser 300 of this embodiment which are substantially the same as the configuration in the first embodiment of the surface emission laser 100, detailed description is omitted.

(Device Operation)

The operation of this embodiment of the surface emission laser 300 is substantially the same as that of the first embodiment of the surface emission laser 100, and therefore description is omitted.

(Manufacturing Method)

Next, the method of manufacturing the second embodiment of the surface emission laser 300 of the present invention is described. In the method of manufacturing this embodiment of the surface emission laser 300, description of parts similar to the method of manufacturing the first embodiment of the surface emission laser 100 is omitted, and only the parts that are different are described.

In the method of manufacturing the first embodiment of the surface emission laser 100, to the element obtained from the process shown in FIGS. 3 to 5, by the CVD method using for example monosilane as the raw material, an insulating layer (not shown in the drawings) being for example a silicon oxide layer (SiOx layer) is formed over the side surface of the pillar portion 110 and the top surface of the first mirror 103. It should be noted that the type of this insulating layer is not limited to a silicon oxide film, and other insulating layers, such as a silicon nitride layer (SiNx layer) or the like may also be used. Next, the portion of the insulating layer formed in the previous process that is on the top surface of the pillar portion 110, and the portion where the contact region 111 will be formed in a subsequent process, are removed by a photolithography process. Next, by the same method as in the first embodiment, the contact region 111 is formed at a predetermined position of the first mirror 103.

Furthermore, by the same method as for the first embodiment of the surface emission laser 100, the first and second electrodes 313 and 315 are formed. By the above process, the surface emission laser 300 shown in FIG. 9 is obtained.

The second embodiment of the surface emission laser 300 has substantially the same effect and benefit as the first embodiment of the surface emission laser 100.

It should be noted that interchanging the p-type and n-type characteristics of the semiconductor layers in the above described embodiments does not depart from the essence of the present invention. In the above described embodiments, the description is of an AlGaAs type, but depending on the wavelength to be oscillated, other materials, such as for example GaInP type, ZnSSe type, InGaN type, GaAsSb type, and GaInAs type semiconductor materials can also be used. In the above described embodiments, the case is described in which the semiconductor substrate 101 is a GaAs substrate, but in place of the GaAs substrate, if an InP substrate is used the same effect and benefit can still be obtained.

What is claimed is:

1. A surface-emitting semiconductor laser having a light-emitting region and a non-light-emitting region, in which light is emitted from the light-emitting region in a direction perpendicular to the semiconductor substrate, wherein:

the light-emitting region includes a resonator formed on the semiconductor substrate, the resonator having a pillar portion surrounded by an insulating layer;

the non-light-emitting region includes a second electrode electrically connected to the resonator; and the contact region is formed in a layer which is part of a layer including at least part of the resonator but is apart from the part of the resonator, the contact region having a higher carrier density than the layer in which the contact region is formed.

2. The surface-emitting semiconductor laser as defined in claim 1, wherein:

the resonator is formed by deposition of a first mirror, an active layer, and a second mirror in sequence; and the pillar portion includes the second mirror and the active layer.

3. The surface-emitting semiconductor laser as defined in claim 2, wherein the contact region is formed in a layer which is part of a layer including the first mirror but is apart from the first mirror.

4. The surface-emitting semiconductor laser as defined in claim 3, wherein the contact region has a higher carrier density than the layer including the first mirror.

5. The surface-emitting semiconductor laser as defined in claim 1, further comprising:

first electrode for supplying a current to the resonator.

6. The surface-emitting semiconductor laser as defined in claim 1, further comprising:

a contact portion electrically connecting the second electrode and the contact region, wherein the contact portion includes a contact hole formed in the insulating layer, and a conductive layer with which the contact hole is filled.

7. The surface-emitting semiconductor laser as defined in claim 5, wherein the first and second electrodes are formed in substantially the same plane.

8. The surface-emitting semiconductor laser as defined in claim 1, wherein the carrier density in the contact region is at least $5 \times 10^{18}$ cm$^{-3}$.

9. The surface-emitting semiconductor laser as defined in claim 1, wherein:

a topmost layer of the layers forming the contact region is formed of an aluminum-gallium-arsenic layer; and the aluminum content of the topmost layer is equal to or less than 20%.

10. The surface-emitting semiconductor laser as defined in claim 1, wherein light is emitted from a rear surface of the semiconductor substrate.

11. A method of manufacturing a surface-emitting semiconductor laser having a light-emitting region and a non-light-emitting region, in which light is emitted from the light-emitting region in a direction perpendicular to the semiconductor substrate, the method comprising the steps of:

(a) forming a resonator, including a pillar portion surrounded by an insulating layer, on the semiconductor substrate in a region for forming the light-emitting region, and forming a layer which is part of a layer including at least part of the resonator but apart from the part of the resonator, in a region for forming the non-light-emitting region;

(b) forming a contact region in the layer which is part of the layer including at least part of the resonator, in the region for forming the non-light-emitting region, the contact region having a higher carrier density than the layer which is part of the layer including at least part of the resonator; and (c) forming a second electrode for supplying a current to the resonator, the second electrode being electrically connected to the resonator with the contact region interposed.

12. The method of manufacturing a surface-emitting semiconductor laser as defined in claim 11, wherein the step (a) includes a step of forming the resonator by depositing a first mirror, an active layer, and a second mirror in sequence, and then forming the pillar portion including at least the second mirror and the active layer.

13. The method of manufacturing a surface-emitting semiconductor laser as defined in claim 12, wherein the step (b) includes a step of forming the contact region in a layer which is part of a layer including the first mirror but is apart from the first mirror.

14. The method of manufacturing a surface-emitting semiconductor laser as defined in claim 13, wherein the step (b) includes a step of forming the contact region such that the carrier density is higher than the carrier density in the layer including the first mirror.

15. The method of manufacturing a surface-emitting semiconductor laser as defined in claim 11, further comprising the step of:

(d) forming a first electrode for supplying a current to the resonator.

16. The method of manufacturing a surface-emitting semiconductor laser as defined in claim 11, wherein:

the step (c) further includes a step of forming a contact hole at a predetermined position of the insulating layer, and a step of filling the contact hole with a conductive material to form a contact portion electrically connecting the second electrode and the contact region.

17. The method of manufacturing a surface-emitting semiconductor laser as defined in claim 11, wherein the contact region is formed to have the carrier density equal to or more than $5 \times 10^{18}$ cm$^{-3}$ in step (b).

18. The method of manufacturing a surface-emitting semiconductor laser as defined in claim 11, wherein a topmost layer of the layers forming the contact region is formed of an aluminum-gallium-arsenic layer, having an aluminum content equal to less than 20% in step (b).

19. The method of manufacturing a surface-emitting semiconductor laser as defined in claim 11, wherein the contact region is formed by impurity diffusion in step (b).

20. The method of manufacturing a surface-emitting semiconductor laser as defined in claim 11, wherein the contact region is formed by ion implantation in step (b).

21. A surface-emitting semiconductor laser having a light-emitting region and a non-light emitting region, in which light is emitted from the light-emitting region in a direction perpendicular to the semiconductor substrate, wherein:

the light-emitting region includes a resonator formed on the semiconductor substrate, with a pillar portion extending from the semiconductor substrate, the pillar portion having an active layer;

the non-light-emitting region includes a contact region electrically connected to the resonator; and the contact region is formed in a layer which is part of a layer including at least part of the resonator but is apart from the part of the resonator, the contact region having a higher carrier density than the layer in which the contact region is formed.

22. The surface-emitting semiconductor laser as defined in claim 1, further comprising:

second insulating layer formed on the layer, wherein the second electrode includes a first portion formed on the second insulating layer and a second portion formed on the contact region.

23. The surface-emitting semiconductor laser as defined in claim 5, wherein the first electrode includes a first portion formed on the insulating layer and a second portion formed on the pillar portion.

* * * * *